United States Patent
Bayadroun

(10) Patent No.: US 6,424,203 B1
(45) Date of Patent: Jul. 23, 2002

(54) POWER SUPPLY CIRCUIT AND METHOD

(75) Inventor: Abdesselam Bayadroun, Seysses (FR)

(73) Assignee: Semiconductor Components Industries LLC, Phoenix, AZ (US)

(*) Notice: Subject to any disclaimer, the term of this patent is extended or adjusted under 35 U.S.C. 154(b) by 0 days.

(21) Appl. No.: 09/773,469

(22) Filed: Feb. 2, 2001

(51) Int. Cl.⁷ .............................. G05F 1/10
(52) U.S. Cl. ..................... 327/536; 327/534
(58) Field of Search .................. 327/530, 534, 327/535, 536, 564, 565, 566

(56) References Cited

U.S. PATENT DOCUMENTS

| | | | |
|---|---|---|---|
| 5,594,381 A | * | 1/1997 | Bingham ..................... 327/29 |
| 5,767,733 A | * | 6/1998 | Grugett ..................... 327/436 |
| 5,933,046 A | * | 8/1999 | Ramet et al. ................ 327/534 |
| 6,154,085 A | * | 11/2000 | Ramakrishnan ............. 327/404 |
| 6,208,197 B1 | * | 3/2001 | Ternullo et al. ............. 327/390 |
| 6,335,653 B1 | * | 1/2002 | Shigehara et al. .......... 327/404 |

* cited by examiner

Primary Examiner—Jeffrey Zweizig
(74) Attorney, Agent, or Firm—James J. Stipanuk

(57) ABSTRACT

An integrated power supply (106) is formed on a semiconductor substrate (200). A first switch (150) is formed in a well region (155) of the semiconductor substrate to have a conduction path (211) for coupling a supply voltage ($V_{BAT}$) to a node (116). A second switch (152) operates in response to a first control signal (COMP) for coupling the node to the well region when a potential of the node is greater than the supply voltage.

16 Claims, 3 Drawing Sheets

POWER SUPPLY CIRCUIT AND METHOD

FIELD OF THE INVENTION

The present invention relates in general to semiconductor devices and, more particularly, to power supplies that include charge pumps formed on integrated circuits.

BACKGROUND OF THE INVENTION

Power supplies used in electronic systems typically are designed to meet particular requirements of the systems. For example, power supplies used to power smart card readers provide supply voltages that may have a value of either three volts or five volts, depending on the specification of the smart card which is inserted in the card reader. Smart cards contains embedded integrated circuits that store users' personal data as well as software programs for running smart card applications. Many card readers operate from a three volt battery for portability.

Before processing smart card data, a smart card reader determines which type of smart card has been inserted and then provides the corresponding supply voltage at a supply terminal. A three volt supply typically is provided with a transistor switch that connects the battery to the supply terminal. A five volt supply typically is generated with a charge pump that pumps charge from the battery to produce a five volt pump voltage at the supply terminal.

Card reader power supplies have a drawback in that their integrated circuits are susceptible to a destructive latchup condition caused when a transistor electrode forward biases with respect to the well region in which the transistor is formed to turn on a parasitic transistor. Previous power supplies bias the well regions to the battery voltage to maintain a reverse bias on the well regions. However, when the pump voltage is greater than the battery voltage, a latchup may still occur. If the well regions are biased to the pump voltage, a latchup can occur when the charge pump is disabled or while the charge pump is starting up, when the battery voltage is greater than the pump voltage.

Hence, there is a need for a power supply and method of providing supply voltages which reduces the susceptibility to a latchup condition in the power supply's integrated circuits in order to improve reliability and avoid damage to the power supply.

DETAILED DESCRIPTION OF THE DRAWINGS

In the figures, elements having the same reference numbers have similar functionality.

Figure 1:
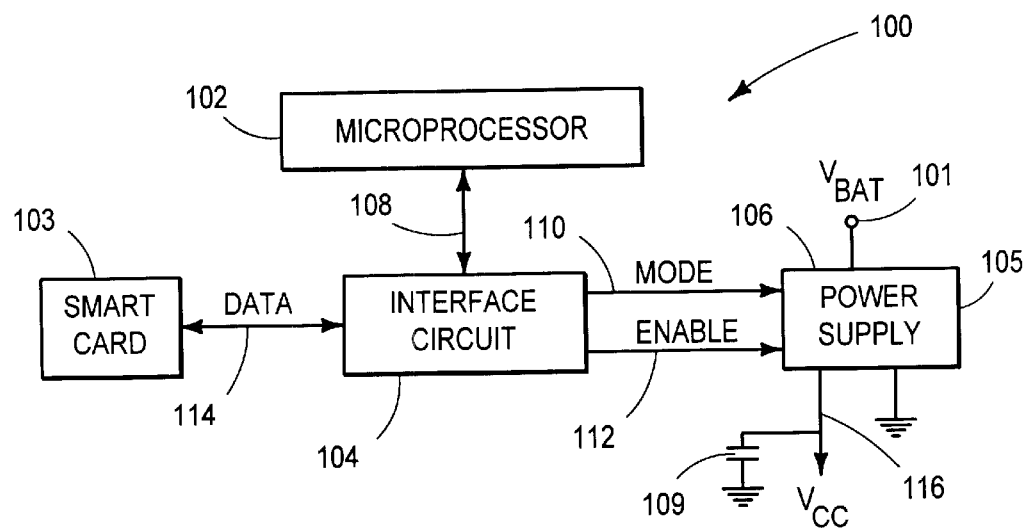
FIG. 1 is a block diagram of a card reader and a smart card.

FIG. 1 shows a block diagram of a card reader 100 for exchanging digital DATA on a conductor 114 to read and update a smart card 103. Card reader 100 includes a microprocessor 102, an interface circuit 104 and a power supply 106. A supply terminal 116 provides a power supply voltage $V_{CC}$ for operating smart card 103. The value of supply voltage $V_{CC}$ may be either three volts or five volts, depending on the specification of smart card 103.

Microprocessor 102 is programmed to execute software applications to process and update information stored on smart card 103. The information is transferred through interface device 104 on a bus 108 which may be a serial bus. The information includes handshaking software that is used to determine whether smart card 103 is specified to operate with a three volt or a five volt supply.

Interface circuit 104 includes an input/output port coupled to conductor 114 and an input/output port coupled to bus 108 for transferring digital DATA between smart card 103 and microprocessor 102. An output provides a digital selection signal MODE on a node 110 for selecting the correct value for supply voltage $V_{CC}$. An output coupled to a node 112 produces a digital enabling signal ENABLE to activate power supply 106 when smart card 103 is inserted.

Power supply 106 operates from a supply voltage $V_{BAT}$=3.0 volts at a supply terminal 101 which typically is provided by a battery (not shown). Power supply 106 operates in either a three volt mode or a five volt mode according to the value of $V_{CC}$ set by the smart card specification. When selection signal MODE has a low logic level, $V_{CC}$ operates at approximately three volts, and when MODE has a high logic level, $V_{CC}$ operates at approximately five volts. Supply voltage $V_{CC}$ is filtered by a capacitor 109 selected to have a value of one microfarad. In one embodiment, a logic low has a value of zero volts and a logic high has a value approximately equal to the larger $V_{BAT}$ and $V_{CC}$. Power supply 106 is housed in an integrated circuit package 105.

Figure 2:
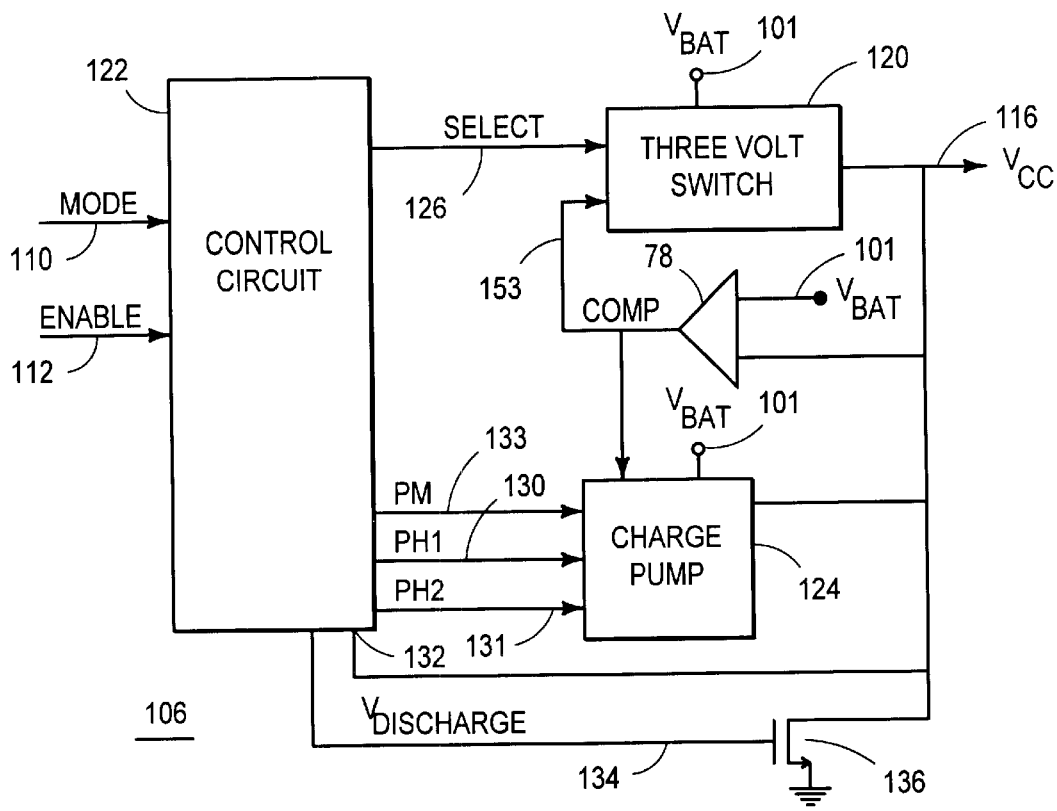
FIG. 2 is a schematic diagram of a power supply of the card reader.

FIG. 2 is a schematic diagram showing power supply 106 in further detail, including a control circuit 122, a three volt switch 120, a comparator 78, a charge pump 124 and a transistor 136.

Control circuit 122 receives selection signal MODE on node 110 and enabling signal ENABLE on node 112. When smart card 103 is inserted in card reader 100, ENABLE has a logic high value to enable or activate power supply 106. When no smart card is present or when a malfunction occurs, ENABLE has a logic low value to disable power supply 106.

When ENABLE is high, MODE determines the value of a digital selection signal SELECT on a node 126 and the activation of a two-phase non-overlapping clock signal comprising a first clock phase PH1 and a second clock phase PH2 provided on nodes 130 and 131, respectively. A biasing clock PM is derived from PH2 and provided on a node 133, as described below. When MODE is logic low, SELECT is logic low and PH1, PH2 and PM are inactive, producing no clocking pulses and effectively disabling charge pump 124. When MODE is logic high, SELECT is logic high and PH1, PH2 and PM are active, producing pulses to enable charge pump 124.

When ENABLE is low, control circuit 122 produces SELECT with a logic high value to disable power supply 106 by opening three volt switch 120 and deactivating PH1, PH2 and PM to turn off charge pump 124. To avoid a latchup condition or other malfunction that can damage card reader 100, control circuit 122 produces a digital signal $V_{DISCHARGE}$ on a node 134 with a logic high value to turn on transistor 136 to bring supply terminal 116 and $V_{CC}$ to zero volts. The operation of control circuit 122 is summarized in Table 1 below.

TABLE 1

| ENABLE | MODE | SELECT | PH1, PH2, PM | $V_{DISCHARGE}$ | $V_{CC}$ |
|---|---|---|---|---|---|
| Low | Low | High | Inactive | High | Zero |
| Low | High | High | Inactive | High | Zero |
| High | Low | Low | Inactive | Low | Three Volts |
| High | High | High | Active | Low | Five Volts |

In the five volt mode, a sensing input 132 is coupled to supply terminal 116 to monitor the level of $V_{CC}$. Control circuit 122 includes regulating circuitry for adjusting the timing of PH1, PH2 and PM to maintain $V_{CC}$ at a constant value of about five volts.

Comparator 78 is an analog comparator that compares the levels of $V_{CC}$ and $V_{BAT}$ and produces a digital comparison signal COMP on a node 153. COMP ensures that well regions of three volt switch 120 and charge pump 124 are biased to the highest potential within power supply 106 to avoid a latchup condition. COMP has a logic high value when $V_{CC} > V_{BAT}$ and a logic low value when $V_{CC} < V_{BAT}$.

Charge pump 124 is configured to pump charge from $V_{BAT}$ to supply terminal 116 to boost supply voltage $V_{CC}$ to about five volts when PH1, PH2 and PM are active.

Three volt switch 120 includes a switching device that is closed in the three volt mode to couple $V_{BAT}$ to supply terminal 116 to provide the approximately three volt value of $V_{CC}$. In the five volt mode, three volt switch 120 is closed during startup so that card reader 100 can operate. Once charge pump 124 pumps $V_{CC}$ to a value higher than $V_{BAT}$, COMP goes to a logic high to open three volt switch 120.

Figure 3:
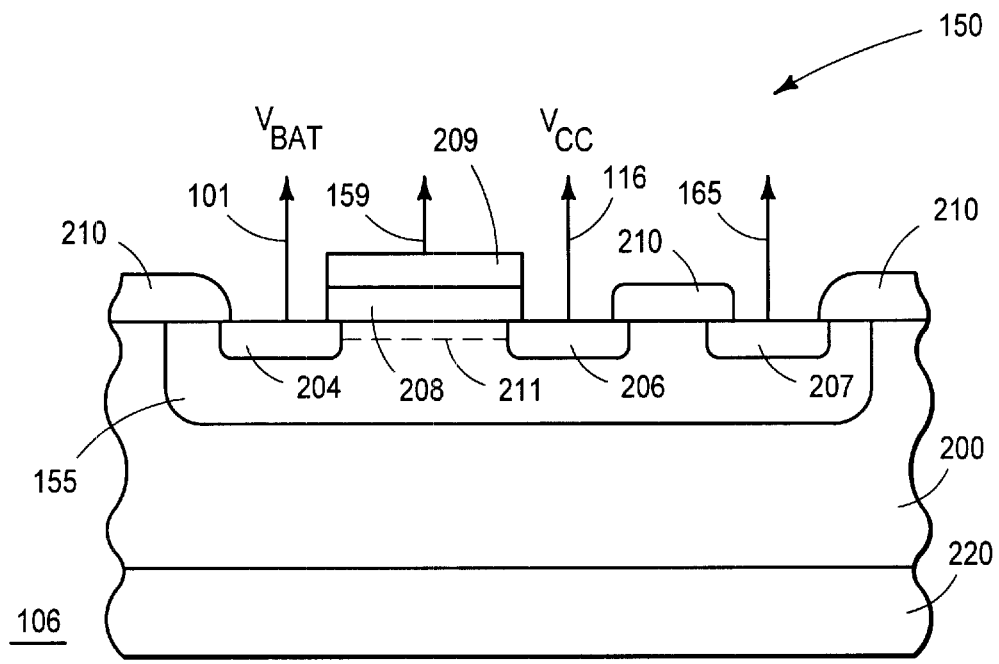
FIG. 3 is a cross-sectional view of a portion of the power supply.

FIG. 3 shows a cross-sectional view of a portion of power supply 106 including transistor 150 formed on a semiconductor substrate 200 mounted to a die attach flag 220 of package 105. In one embodiment, substrate 200 is formed with a p-type semiconductor material such as silicon. A well region 155 is formed by lightly doping substrate 200 with an n-type dopant. A well contact 207 is formed with heavily doped n-type dopants to provide an ohmic contact to a node 165 for biasing well region 155. Substrate 200 is biased at ground potential.

Transistor 150 is formed within well region 155 as a p-channel metal-oxide-semiconductor field effect (PMOS) transistor, including a source 204, a drain 206 and a gate electrode 209 formed over a gate dielectric 208. Source 204 and drain 206 are formed with heavily doped p-type dopants for contacting a source to drain conduction path 211 activated by a negative gate to source voltage. A dielectric layer 210 is formed and patterned over transistor 150 as shown to provide electrical isolation between electrodes.

Figure 4:
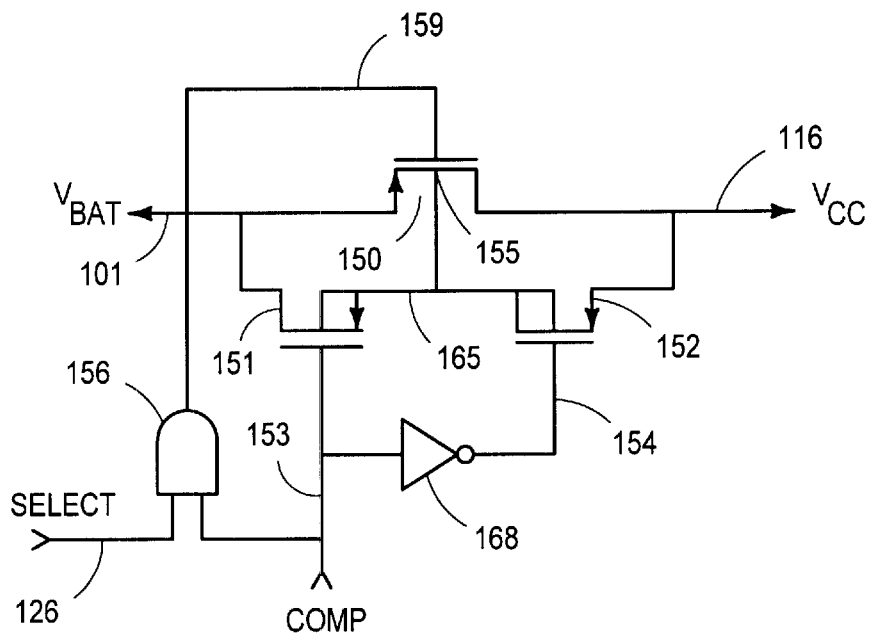
FIG. 4 is a schematic diagram of a three volt switch of the power supply.

Source 204, well region 155 and substrate 200 form the emitter, base and collector, respectively, of a parasitic PNP bipolar transistor. Drain 206, well region 155 and substrate 200 form the emitter, base and collector, respectively, of another parasitic PNP bipolar transistor. Transistor 150 may be associated with other parasitic transistors on substrate 200 either alone or in combination with other transistors. Such parasitic transistors can cause a destructive latchup of power supply 106 if turned on. To avoid such a latchup condition, the junctions formed by source 204 and well region 155 and by drain 206 and well region 155 are maintained at substantially a zero or reverse bias. Substrate 200 is maintained at ground potential, which is a lower potential than that of other nodes of FIG. 4 is a schematic diagram showing three volt switch 120 in further detail, including transistors 150–152, an inverter 168 and a gate 156. Three volt switch 120 receives supply voltage $V_{BAT}$ on supply terminal 101, comparison signal COMP on node 153 and selection signal SELECT on node 126.

Transistor 150 is a PMOS transistor operating as a switch to route $V_{BAT}$ to supply terminal 116. A gate operates as a control electrode for enabling a source to drain conduction path between nodes 101 and 116 when a node 159 has a low logic level of about zero volts. In one embodiment, transistor 150 routes about ten milliamperes of load current to supply terminal 116. When transistor 150 is turned on, its resistance develops a typical voltage drop with the load current of about fifteen millivolts from supply terminal 101 to supply terminal 116. That is, when a load current flows, ($V_{BAT}-V_{CC}$)=0.015 volts. Transistor 150 is formed in well region 155 which is biased to a node 165.

Transistor 151 is a PMOS transistor having a drain to source conduction path from supply terminal 101 to node 165. A gate is coupled to a node 153 to operate as a control electrode. Transistor 152 is a PMOS transistor having a drain to source conduction path coupled between node 165 and supply terminal 116, and a gate coupled to a node 154 to operate as a control electrode. In the embodiment of FIG. 4, transistors 151 and 152 are also formed in n-well 155.

Gate 156 is a standard integrated circuit gate that performs an AND logic function. An output is coupled to node 159 for driving the gate of transistor 151. In the three volt mode, SELECT is logic low and COMP is low because charge pump 124 is disabled. Hence, node 159 is low and transistor 150 is turned on. In the five volt mode, SELECT is logic high. COMP is logic low during the startup period of charge pump 124, owing to the fifteen millivolt drop across transistor 150 described above. After the startup period, when charge pump 124 pumps $V_{CC}$ to a level above three volts, the load current flows from charge pump 124 and $V_{CC}$ is greater than $V_{BAT}$. Hence, COMP drives node 159 to a logic high to turn off transistor 150.

Inverter 168 is a standard logic inverter having an input coupled to node 153 for receiving COMP and an output coupled to node 154 and to the gate of transistor 152. Hence, nodes 153 and 154 have opposite logic values, so when transistor 151 is turned on, transistor 152 is turned off, and vice versa.

Note that in the three volt mode, all nodes of power supply 106 are at potentials less than or equal to the value of $V_{BAT}$. However, in the five volt mode, these nodes may have potentials less than or equal to $V_{BAT}$ during startup, but greater than or equal to $V_{BAT}$ once charge pump 124 pumps $V_{CC}$ to a level greater than $V_{BAT}$. For example, the drain of transistor 150 is biased to a potential less than $V_{BAT}$ during startup but greater than $V_{BAT}$ once charge pump 124 pumps $V_{CC}$ up to its final five volt level.

Power supply 106 avoids a latchup condition by ensuring that the potential of well region 155 is dynamically adjusted during five volt operation in accordance with the level of $V_{CC}$. In particular, assume that $V_{CC} < V_{BAT}$, so COMP is logic low and transistor 151 initially is turned on. Since node 153 is low, transistor 151 turns on to couple node 165 to terminal 101, thereby biasing well region 155 to a potential equal to $V_{BAT}$. Node 154 is high, turning off transistor 152 to isolate node 165 and well region 155 from $V_{CC}$. Hence, the drain and source of transistor 150 are at potentials equal to or lower than the potential of node 165 and well region 155, thereby avoiding a forward bias condition that could turn on a parasitic transistor and cause a latchup.

Now assume that $V_{CC}>V_{BAT}$. COMP is logic high, setting node 159 high and turning off transistor 150. Transistor 151 turns off to isolate node 165 and well region 155 from $V_{BAT}$, while transistor 152 turns on to couple node 165 to terminal 116, thereby biasing well region 155 to a potential equal to $V_{CC}$. Since the drain and source of transistor 150 are at potentials equal to or lower than the potential of well region 155, a forward bias and latchup condition are avoided. Hence, depending on the value of $V_{CC}$, well region 155 is dynamically biased to a potential substantially equal to the higher of $V_{BAT}$ and $V_{CC}$.

Figure 5:
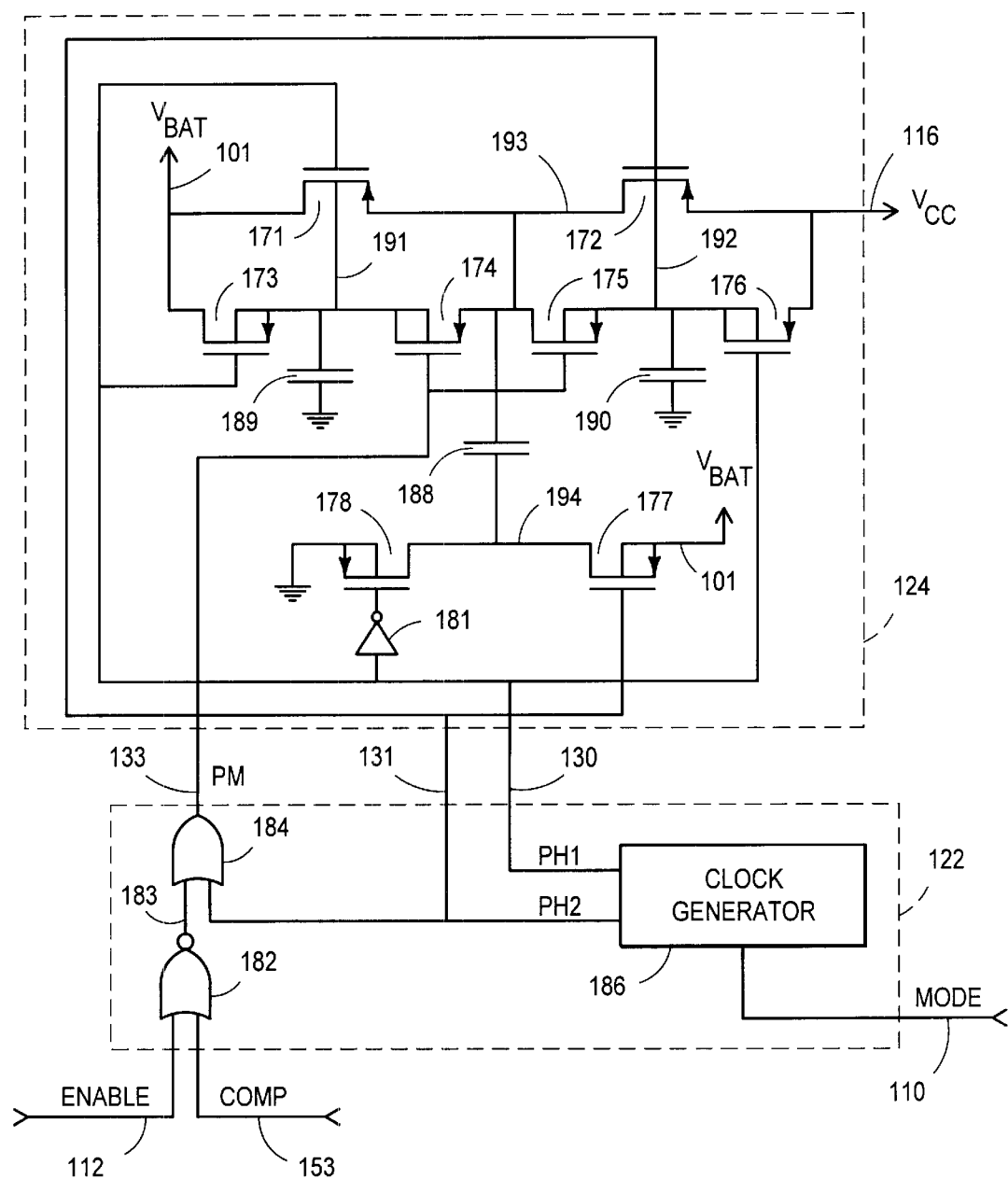
FIG. 5 is a schematic diagram of a charge pump of the power supply.

FIG. 5 is a schematic diagram showing charge pump 120 and a portion of control circuit 122. Charge pump 120 includes transistors 171–178, capacitors 188–190 and an inverter 181. Control circuit 122 includes a gate 182, a gate 184 and a clock generator 186 to provide control and timing signals necessary to operate charge pump 120.

Clock generator 186 includes an oscillator that generates a reference clock for producing first and second clock phases PH1 and PH2 on nodes 130 and 131, respectively. PH1 and PH2 are active low and opposite in phase. A condition in which PH1 is low while PH2 is high is referred to as a first clock phase, and a condition in which PH2 is low while PH1 is high is referred to as a second clock phase. An input is coupled to node 110 for receiving selection signal MODE, which activates clock generator 186 when power supply 105 is operating in the five volt mode and disables clock generator 186 when power supply 105 operates in the three volt mode. Hence, clocks PH1 and PH2 are generated in the five volt mode and deactivated or disabled in the three volt mode.

Gate 182 comprises a standard integrated circuit gate that performs a logic NOR of enabling signal ENABLE and comparison signal COMP to produce an output signal on a node 183. Gate 184 comprises a standard integrated circuit gate that performs a logic OR function of the output signal of NOR gate 182 with second clock phase PH2 to produce biasing clock PM on node 133 when either ENABLE is logic high or COMP is logic high, i.e., when $V_{CC}>V_{BAT}$.

When ENABLE and COMP are both logic low, clock generator 186 is disabled and PH1, PH2 and PM are inactive. PM is logic high and transistors 174–175 are turned off. When either ENABLE or COMP are logic high, transistors 174–175 are controlled by biasing clock PM to turn on during the second clock phase and off during the first clock phase.

Transistor 178 is an n-channel metal-oxide-semiconductor (NMOS) field effect transistor operating in an enhancement mode. Transistors 171–177 are PMOS transistors operating in an enhancement mode. Transistors 171, 173 and 174 are formed in a well region biased to a node 191, while transistors 172, 175 and 176 are formed in a well region biased to a node 192.

Transistors 171–172 and 177–178 function as a DC (direct current) to DC converter that pumps charge from $V_{BAT}$ to supply terminal 116 to generate $V_{CC}$ with a value of about five volts. During the first clock phase, transistors 171 and 178 turn on to charge capacitor 188 to a voltage substantially equal to $V_{BAT}$, while transistors 172 and 176 are turned off. During the second clock phase, 171 and 178 are turned off and transistors 172 and 176 turn on to pump charge stored on capacitor 188 to supply terminal 116. In one embodiment, capacitor 188 has a value of approximately two hundred picofarads.

Note that to avoid turning a parasitic transistor and initiating a latchup, node 191 is biased at a more positive voltage than the drain and source of transistor 171, while node 192 is biased at a more positive voltage than the drain and source of transistor 172. The drain of transistor 171 is biased to $V_{BAT}$ while the source of transistor 172 is biased to $V_{CC}$. The source of transistor 171 and drain of transistor 172 are biased at the potential of node 193, which has a potential approximately equal to $V_{BAT}$ during the first clock phase and to $V_{CC}$ during the second clock phase. Since $V_{CC}$ is less than $V_{BAT}$ during startup and greater than $V_{BAT}$ during regulation, the biasing of nodes 191 and 192 is dynamically set to the potential of $V_{BAT}$ during startup and to the potential of $V_{CC}$ during regulation.

The dynamic biasing is achieved as follows. Recall that during startup, selection signal SELECT is logic high to activate three volt switch 120 to couple terminal 101 to terminal 116 to operate $V_{CC}$ at about three volts minus the fifteen millivolt voltage drop across three volt switch 120 described above. Transistors 173 and 176 are turned on to bias nodes 191 and 192 to approximately three volts. Once $V_{CC}$ is pumped above $V_{BAT}$, three volt switch 120 turns off and the biasing of nodes 191–192 is controlled by PH1 and PM. During the first clock phase, PH1 turns on transistors 173 and 176 while PM turns off transistors 174–175. Nodes 191 and 193 are biased to $V_{BAT}$ while node 192 is biased to $V_{CC}$. During the second clock phase, PM turns on transistors 174–175 while PH1 turns off transistors 173 and 176. Transistors 174–175 are turned on to set the potentials of nodes 191 and 192 to the potential of node 193, which is approximately equal to the potential of $V_{CC}$. Hence, the potentials of the well regions coupled to nodes 191–192 are dynamically adjusted to the highest circuit potential, thereby avoiding a destructive latchup condition.

Capacitors 189–190 function to filter out voltage spikes generated on nodes 191–192 during switching transitions. In one embodiment, capacitors 189–190 have a value of about ten picofarads.

From the foregoing description, it should be appreciated that the present invention provides an integrated power supply for a smart card reader and a method of regulating that dynamically adjusts the biasing of well regions within the integrated power supply to avoid a latchup condition. A first switch is formed in a well region of a semiconductor substrate to provide a conduction path for coupling a supply voltage to a node. A second switch operates in response to a control signal to couple the node to the well region when a potential of the node is greater than the supply voltage. By dynamically adjusting the bias on well regions, the power supply described herein is more robust and has a higher reliability than previous power supplies.

What is claimed is:

1. An integrated circuit, comprising:
   a semiconductor substrate;
   a first switch formed in a well region of the semiconductor substrate and having a conduction path for coupling a supply voltage to a node;
   a second switch operating in response to a first control signal for coupling the node to the well region when a potential of the node is greater than the supply voltage;
   a third switch operating in response to a second control signal for biasing the well region to the supply voltage when a potential of the node is less than the supply voltage; and
   a comparator having a first input coupled for receiving the supply voltage, a second input coupled to the node, and an output for producing the second control signal when the potential of the node is greater than the supply voltage.

2. The integrated circuit of claim 1, wherein the first switch comprises a first transistor and the second switch comprises a second transistor.

3. The integrated circuit of claim 2, where the first transistor has a control electrode coupled for receiving the first control signal.

4. The integrated circuit of claim 1, further comprising an integrated circuit package for housing the semiconductor substrate.

5. A power supply, comprising:
- a charge pump having an input for receiving a supply voltage for generating a pump voltage at a first node of the power supply;
- a first transistor having a conduction path coupled for routing the supply voltage to the first node in response to a first control signal; and
- a second transistor having a control electrode for receiving a control signal for coupling a well region of the first transistor to the first node when the pump voltage is greater than the supply voltage.

6. The power supply of claim 5, further comprising a third transistor having a conduction path for biasing the well region to the supply voltage when the pump voltage is less than the supply voltage.

7. The power supply of claim 6, further comprising a comparator having a first input coupled for receiving the supply voltage, a second input coupled to the first node, and an output for providing the control signal.

8. The power supply of claim 7, further comprising an inverter having an input coupled to the output of the comparator and an output coupled to the control electrode of the second transistor.

9. The power supply of claim 5, wherein the charge pump includes:
- a third transistor having a control electrode coupled for receiving a first clock signal to enable a conduction path between the input of the charge pump and a second node to induce a charge on a capacitance; and
- a fourth transistor having a control electrode coupled for receiving the first clock signal for biasing a well region of the third transistor to the supply voltage when the supply voltage is greater than the pump voltage.

10. The power supply of claim 9, wherein the charge pump further comprises a fifth transistor operating in response to a second clock signal for coupling the second node to the well region of the third transistor when the supply voltage is less than the pump voltage.

11. The power supply of claim 9, wherein the charge pump further includes:
- a fifth transistor operating in response to the second clock signal for pumping the charge to the first node to develop the pump voltage; and
- a sixth transistor operating in response to the first clock signal for coupling the first node to a well region of the fifth transistor when the pump voltage is greater than the supply voltage.

12. The power supply of claim 11, wherein the charge pump further comprises a seventh transistor operating in response to the second clock signal for enabling a conduction path from the second node to the well region of the fifth transistor when the pump voltage is less than the supply voltage.

13. A method of providing a supply voltage, comprising the steps of:
- enabling a first transistor with a first control signal to transfer a supply voltage to a first node as an output voltage;
- enabling a first conduction path with the first control signal to bias a well region of the first transistor to the supply voltage;
- enabling a second conduction path with a second control signal to bias the well region to the output voltage when the supply voltage is less than the output voltage; and
- pumping a charge from a second node to the first node with a clock signal to produce the output voltage.

14. The method of claim 13, wherein the step of pumping includes the step of enabling a second transistor with the clock signal to pump the charge from the second node to the first node.

15. The method of claim 14, further comprising the step of enabling a third conduction path with the clock signal to bias a well region of the second transistor to the supply voltage when the supply voltage is greater than the output voltage.

16. The method of claim 15, further comprising the step of enabling a fourth conduction path with the clock signal to bias the well region of the second transistor to the output voltage when the supply voltage is less than the output voltage.

* * * * *